(12) United States Patent
Wang et al.

(10) Patent No.: US 10,103,207 B2
(45) Date of Patent: Oct. 16, 2018

(54) DISPLAY DEVICE

(71) Applicant: BOE Technology Group Co., Ltd., Beijing (CN)

(72) Inventors: Wei Wang, BDA Beijing (CN); Yafeng Yang, BDA Beijing (CN); Xiaochuan Chen, BDA Beijing (CN); Jing Lv, BDA Beijing (CN); Jifeng Tan, BDA Beijing (CN); Can Zhang, BDA Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/809,158

(22) Filed: Nov. 10, 2017

(65) Prior Publication Data

US 2018/0138243 A1   May 17, 2018

(30) Foreign Application Priority Data

Nov. 11, 2016   (CN) .......................... 2016 1 1041959

(51) Int. Cl.
*H01L 27/32* (2006.01)
*G02B 5/20* (2006.01)
(Continued)

(52) U.S. Cl.
CPC ............ *H01L 27/322* (2013.01); *G02B 5/201* (2013.01); *G02B 5/284* (2013.01);
(Continued)

(58) Field of Classification Search
None
See application file for complete search history.

(56) References Cited

U.S. PATENT DOCUMENTS

| 7,057,339 B2 * | 6/2006 | Boroson | ............... H01L 27/322 313/110 |
| 7,777,413 B2 * | 8/2010 | Kuma | ................. H01L 51/5265 257/40 |

(Continued)

*Primary Examiner* — Benjamin Sandvik
(74) *Attorney, Agent, or Firm* — Fay Sharpe LLP

(57) ABSTRACT

The present disclosure relates to a display device in the field of display. The display device comprises a plurality of sub-pixel areas, each of which corresponds to one color, wherein the display device comprises a reflecting interface, a photon conversion layer, and a light filter layer arranged sequentially along a display light emergent direction; in the sub-pixel area corresponding to a target color: the light filter layer is structured to transmit light within a first wavelength range in the display light emergent direction and reflect the light within a second wavelength range, wherein the first wavelength range refers to the wavelength range corresponding to the target color, and the second wavelength range includes a visible light waveband excluding the first wavelength range; the reflecting interface is structured to reflect the light from the light filter layer; and the photon conversion layer is structured to convert the transmitted light within a third wavelength range to the light within the first wavelength range, the third wavelength range is a preset wavelength range beyond the first wavelength range and the second wavelength range includes the third wavelength range. The present disclosure can improve the color conversion efficiency of the display device.

20 Claims, 3 Drawing Sheets

(51) Int. Cl.
*G02B 5/28* (2006.01)
*H01L 51/52* (2006.01)
(52) U.S. Cl.
CPC ...... *H01L 27/3211* (2013.01); *H01L 51/5265* (2013.01); *H01L 51/5271* (2013.01); *H01L 51/5284* (2013.01); *H01L 2251/558* (2013.01)

(56) References Cited

U.S. PATENT DOCUMENTS

| | | | |
|---|---|---|---|
| 2005/0116619 A1* | 6/2005 | Kuma | H01L 27/322 |
| | | | 313/503 |
| 2010/0053043 A1* | 3/2010 | Sakamoto | H01L 27/3213 |
| | | | 345/77 |
| 2015/0219958 A1* | 8/2015 | Zhang | G02B 5/286 |
| | | | 349/61 |
| 2017/0141162 A1* | 5/2017 | Kim | H01L 27/322 |
| 2018/0019238 A1* | 1/2018 | Kim | H01L 27/016 |

* cited by examiner

DISPLAY DEVICE

This application claims priority to Chinese Patent Application No. 201611041959.5, filed with the State Intellectual Property Office on Nov. 11, 2016 and titled "DISPLAY DEVICE", the entire contents of which are incorporated herein by reference.

TECHNICAL FIELD

The present disclosure relates to the field of display, and more particularly, to a display device.

BACKGROUND

An electroluminescent device is a self-luminous display device and attracts extensive attention with its advantages such as wide viewing angle, high contrast, and fast response, etc. With the development of the organic light emitting materials, the organic electroluminescent devices (for example, an Organic Light Emitting Diode, OLED) can realize more excellent brightness, drive voltage, response rate, and color gamut, compared with the inorganic electroluminescent devices, therefore become the mainstream in the current display device market.

In order to overcome the defects of low light emitting efficiency and short life span of the traditional blue OLED materials, more and more display device manufacturers currently turn to a white OLED with a color filter (CF, also called a color light filter) to realize color display.

However, although the light emitting efficiency of the white OLED material itself is very high, most of the light energy will lose during various color conversion processes (for example, generally the light emitting efficiency for the traditional color filter is only around 33%), which has gradually become the bottleneck to restrict the overall performance of white OLED products from being improved.

SUMMARY

The present disclosure provides a display device capable of improving the color conversion efficiency thereof to solve the defects in the prior art.

The disclosure provides a display device, comprising a plurality of sub-pixel areas, each of which corresponds to one color, wherein the display device comprises a reflecting interface, a photon conversion layer, and a light filter layer arranged sequentially along a display light emergent direction; in the sub-pixel area corresponding to a target color: the light filter layer is structured to transmit light within a first wavelength range along the display light emergent direction and reflect the light within a second wavelength range, wherein the first wavelength range refers to the wavelength range corresponding to the target color, and the second wavelength range includes a visible light waveband excluding the first wavelength range; the reflecting interface is structured to reflect the light from the light filter layer; and the photon conversion layer is structured to convert the transmitted light within a third wavelength range to the light within the first wavelength range, the third wavelength range is a preset wavelength range beyond the first wavelength range, and the second wavelength range includes the third wavelength range; wherein, the target color is any of colors corresponding to the plurality of sub-pixel areas.

In one possible embodiment, the display device further comprises a light emitting layer, wherein a first electrode layer is arranged on one side of the light emitting layer that faces the display light emergent direction and a second electrode layer is arranged on another side thereof; the photon conversion layer is located between the light filter layer and the light emitting layer, and at least one of a surface of the first electrode layer that faces the display light emergent direction and a surface of the second electrode layer that faces the display light emergent direction forms the reflecting interface.

In one possible embodiment, the photon conversion layer comprises an electroluminescent material, a first electrode layer is arranged on one side of photon conversion layer that faces the display light emergent direction and a second electrode layer is arranged on an other side thereof; an interface between the second electrode layer and the photon conversion layer forms the reflecting interface.

In one possible embodiment, the light filter layer comprises a first optical film, a first medium layer, and a second optical film; in each of the sub-pixel area,
the first optical film and the second optical film are located on a side of the first medium layer that is close to the photon conversion layer and a side that is away from the photon conversion layer respectively, to form a resonant cavity between the first and the second optical films to transmit the light within the first wavelength range; and an interface between the first optical film and the first medium layer and/or an interface between the second optical film and the first medium layer form the reflecting interface used to reflect the light within the second wavelength range.

In one possible embodiment, at least one medium layer and at least one optical film are included between the first medium layer and the second optical film, to form a multi-mirror resonant cavity between the first optical film and the second optical film.

In one possible embodiment, the third wavelength range is preset in accordance with an emission spectrum of a display light source.

In one possible embodiment, the display device further comprises a substrate; wherein, the substrate is located on a side of the reflecting interface that is away from the photon conversion layer, or the substrate is located between the reflecting interface and the light filter layer, or the substrate is located on a side of the light filter layer that is away from the photon conversion layer.

In one possible embodiment, in the sub-pixel area corresponding to the target color, the photon conversion layer comprises at least one of a first light emitting material and a second light emitting material and a third light emitting material; wherein, the first light emitting material is used to absorb a photon whose wavelength is within the third wavelength range in order to radiate a photon whose wavelength is within the first wavelength range; the second light emitting material is used to absorb a photon whose wavelength is within the third wavelength range in order to radiate a plurality of photons among which at least one photon's wavelength is within the first wavelength range; and the third light emitting material is used to absorb a plurality of photons whose wavelengths are within the third wavelength range in order to radiate a photon whose wavelength is within the first wavelength range.

In one possible embodiment, the photon conversion layers in the plurality of sub-pixel areas are all made of the same material.

In one possible embodiment, the colors corresponding to the plurality of sub-pixel areas include red, green, and blue; in the sub-pixel area corresponding to red, the photon conversion layer includes a first light emitting material and a second light emitting material; in the sub-pixel area corresponding to green, the photon conversion layer includes the first light emitting material and a third light emitting material; and in the sub-pixel area corresponding to blue, the photon conversion layer includes the third light emitting material; wherein, the first light emitting material is used to absorb a photon whose wavelength is within the third wavelength range in order to radiate a photon whose wavelength is within the first wavelength range; the second light emitting material is used to absorb a photon whose wavelength is within the third wavelength range in order to radiate a plurality of photons among which at least one photon's wavelength is within the first wavelength range; and the third light emitting material is used to absorb a plurality of photons whose wavelengths are within the third wavelength range in order to radiate a photon whose wavelength is within the first wavelength range.

It can be concluded from the above technical solutions that, based on the arrangement of the reflecting interface, the photon conversion layer and the light filter layer in the present disclosure, the light within the specified wavelength range can be reflected back and forth between the light filter layer and the optical plane so that the light can be converted to the target color light after one or more transmissions through the photon conversion layer. Thus, light within snore light emitting wavebands can be converted to the required color light to improve the color conversion efficiency of the display device.

BRIEF DESCRIPTION OF THE DRAWINGS

To describe the technical solutions in the embodiments of the present disclosure more clearly, the following briefly introduces the accompanying drawings that illustrate aspects of the various embodiments. The accompanying drawings in the following description show some embodiments of the present disclosure.

DETAILED DESCRIPTION OF THE EMBODIMENTS

The embodiments of the present disclosure will be described in further detail with reference to the enclosed drawings, to clearly present the objects, technique solutions, and advantages of the present disclosure.

Figure 1:
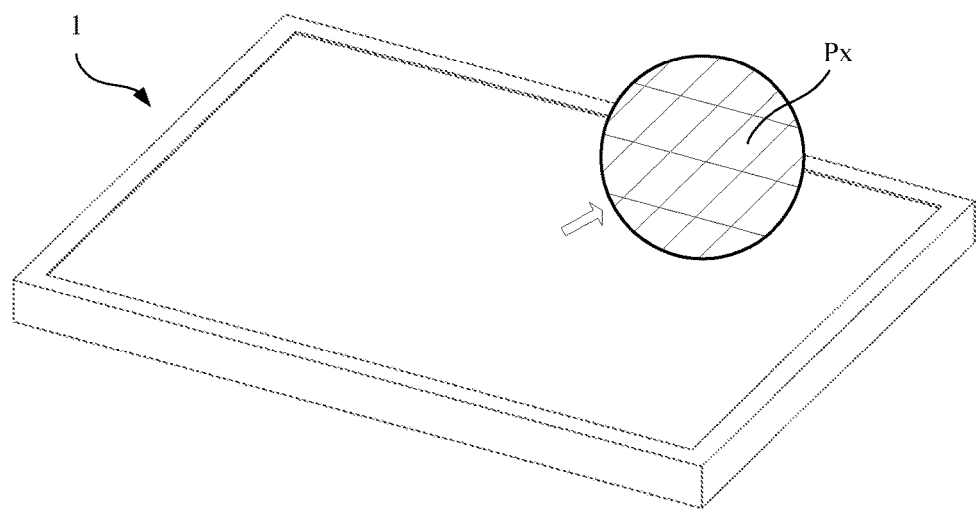
FIG. 1 is a structural diagram of a display device of an embodiment of the present disclosure.

FIG. 1 is a structural diagram of a display device provided by an embodiment of the present disclosure. Referring to FIG. 1, a display device 1 in the embodiment of the present disclosure comprises a plurality of sub-pixel areas Px. Each sub-pixel area Px corresponds to one color. Therefore, all of the sub-pixel areas corresponding to one same color can form the monochrome display for the display device and the sub-pixel areas corresponding to various colors respectively can form the color display for the display device. For example, the plurality of sub-pixel areas of the display device can be arranged in an array form in a display area of the display device. Meanwhile, the sub-pixel areas in the odd number row and the odd number column correspond to blue, the sub-pixel areas in the odd number row and the even number column correspond to red, the sub-pixel areas in the even number row and the odd number column correspond to green, and the sub-pixel areas in the even number row and the even number column correspond to white to form the color display for the display device.

It should be noted that the display device in the embodiment of the present disclosure can be any product or part with display functionality such as a display panel, a mobile phone, a tablet, TV, a display device, a laptop, a digital photo frame, a navigator, or the like. In addition, the quantity, size, shape, and arrangement mode of the plurality of sub-pixel areas can be set in accordance with actual demands. Each of the colors corresponding to the plurality of sub-pixel areas can correspond to a certain wavelength range within the visible light waveband. The specific boundary value of the wavelength range can be set in accordance with actual demands, which will not be limited by the embodiments of the present disclosure.

Figure 2:
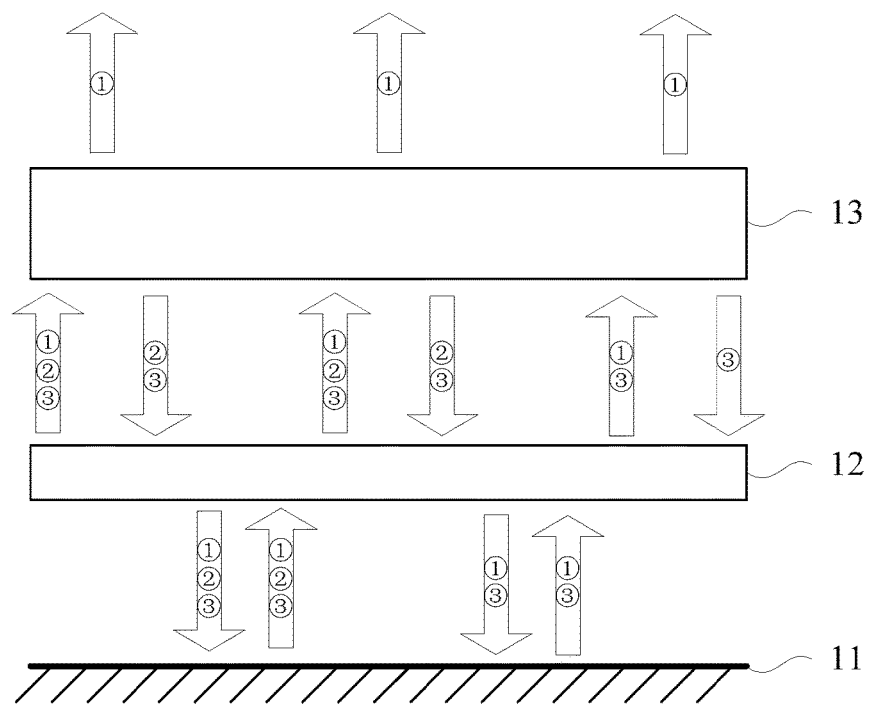
FIG. 2 is a diagram of a light path within a sub-pixel area of a display device of an embodiment of the present disclosure.

FIG. 2 is a diagram of a light path within a sub-pixel area of a display device of an embodiment of the present disclosure. The display device 1 in the embodiment of the present disclosure comprises a reflecting interface 11, a photon conversion layer 12, and a light filter layer 13 arranged sequentially along a display light emergent direction (the direction from the light source towards the emergent side of a display light). The display light emergent directions in FIG. 1 and FIG. 2 are from bottom to top. A color corresponding to the sub-pixel area in FIG. 2 is called a target color (i.e., the target color is any of the colors corresponding to the plurality of sub-pixel areas). In the sub-pixel area:

the light filter layer is structured to transmit the light within a first wavelength range along the display light emergent direction and reflect the light within a second wavelength range. Wherein, the first wavelength range refers to the wavelength range corresponding to the target color, and the second wavelength range is a preset wavelength range the light within which can be reflected by a light filter layer. The second wavelength range may include all visible light wavebands excluding the first wavelength range. For example, the first wavelength range can be set from 622 nanometers to 770 nanometers, when the target color is red; and the second wavelength range includes wavelength range from 350 nanometers to 622 nanometers (i.e., the wavelength range excluding the red waveband within the visible wavebands). Therefore, the light filter layer may transmit the light corresponding to the target color and reflect the light corresponding to other colors within the visible wavebands.

The reflecting interface is structured to reflect the light from the light filter layer. Therefore, the light within the third wavelength range can be reflected back and forth between the reflecting interface and the light filter layer, and the light within the first wavelength range between the reflecting interface and the light filter layer can transmit the light filter layer along the display light emergent direction after being reflected by the reflecting interface.

The photon conversion layer is structured to convert the transmitted light within the third wavelength range to the light within the first wavelength range. The third wavelength range is preset beyond the first wavelength range. The second wavelength range includes the third wavelength range. Wherein, the third wavelength range, i.e., the wavelength range of the light which can be converted by the photon conversion layer to be within the first wavelength range, generally is determined by an internal structure of the photon conversion layer and the materials that the photon conversion layer is made of. For example, for the photon conversion layer that is formed of kinds of laminated photoluminescent materials or the photon conversion layer that is formed by mixing kinds of photoluminescent materials in the base materials, the wavelength range of the absorption spectrum corresponding to the radiation light within the second wavelength range is the third wavelength range. The wavelength range of the absorption spectrum correlates to the materials, the way to mix the materials, the amount of the materials, the film thickness of the photon conversion layer, etc. Therefore, in practice, the materials and/or internal structure of the photon conversion layer may be set up in accordance with the required third wavelength range, to realize the expected light conversion effect.

It is evident that based upon the arrangement of the reflecting interface, the photon conversion layer, and the light filter layer in the embodiments of the present disclosure, the light within the third wavelength range can be reflected back and forth between the light filter layer and the optical plane so that the light can be converted to the light corresponding to the target color after one or more transmissions through the photon conversion layer. Thus, light within more light emitting wavebands can be converted to the light corresponding to the required color light to improve the color conversion efficiency of the display device.

For example, arrows in FIG. 2 arranged from left to right show the procedure that the light beam propagates in the display device. Initially, the light beam is made of part 1 ①, part 2 ②, and part ③, wherein part 1 ① is the light within the first wavelength range, part 2 ② is the light within the second wavelength range, and part 3 ③ is the light within the third wavelength range excluding the first wavelength range and second wavelength range. When the light beam shines on the light filter layer 13 along display the light emergent direction, part 1 ① of the light beam will be transmitted through the light filter 13, while part 2 ② and part 3 ③ will be reflected back and shine on the photon conversion layer 12 based upon the characteristic of the light filter layer. Based upon the characteristic of the photon conversion layer, part 2 ② of the light beam will be partially converted to the light within the first wavelength range, so that the light beam contains part 1 ①, part 2 ②, and part ③ again after being transmitted through the photon conversion layer 12. Afterwards, the light beam will shine on the reflecting interface 11 after being transmitted through the photon conversion layer 12 and shine again on the photon conversion layer 12 along the display light emergent direction after being reflected. The light of part 2 ② of the light beam that is transmitted through the photon conversion layer is further converted to the light of part 1 ② and then shines on the light filter layer 13. Here, the light of part 1 ① is transmitted and the light of part 2 ② and part 3 ③ is reflected. Understandably, after being reflected back and forth for enough times, the light of part 2 ② of the light beam will almost completely be converted to the light of part 1 ① and is transmitted when shining on the light filter layer 13. Finally, only the light of part 3 ③ of the light beam will be reflected back and forth between the light filter layer 13 and the reflecting interface 11 until it is completely absorbed, converted, or dispersed. It should be noted that, the light beyond the third wavelength range does not belong to the visible light and may not be converted to the visible light by the photon conversion layer and not be involved in processes of imaging and displaying, which will not be discussed in the embodiment of the present disclosure. In addition, the light filter layer 13 cannot completely transmit the light of part 1 ① in theory, but the reflected light of part 1 ① still can be transmitted through the light filter layer 13 after being reflected by the reflecting interface 11. Therefore, it is approximately equivalent to the situation of the complete transmission in the present embodiment.

Overall, the light emitted from the each sub-pixel unit along the display light emergent direction is the respective light within the first wavelength range, i.e. the light corresponding to its target color respectively within the visible light waveband, therefore the brightness and chroma of each pixel can be modulated with the light and dark ratio among the sub-pixel units to form the display image based upon the arrangement and combination of the pixels. Compared with the prior art, not only the light corresponding to the target color but also the light within other wavelength ranges is utilized when the displaying is performed in the embodiment of the present disclosure, so that the higher color conversion efficiency can be realized under the same light-shining condition. Based upon this, the display product in the embodiment of the present disclosure not only has higher brightness but also has lower power consumption and therefore has more excellent product performance.

It should be noted that the light filter layer in the embodiment of the present disclosure can be implemented with any kind of the single or multiple layer structure with the light transmission and reflection characteristics. The photon conversion layer in the embodiment of the present disclosure can be implemented with any kind of the single or multiple layer structure with the conversion characteristic. The reflecting interface in the embodiment of the present disclosure can be implemented with any kind of the single material or a combination of multiple materials with the reflecting characteristic. In addition, the light filter layer, the photon conversion layer and the reflecting interface may not be arranged or may be arranged in any way in the opaque area of the display device, and the color conversion efficiency can be improved, which will not be limited by the embodiment of the present disclosure.

It should be noted that the form of the light source adopted in the display device in the embodiment of the present disclosure is not limited. For example, the light source may be a self-luminous light, a back light, an ambient light, etc. Since the effect of the embodiment of the present disclosure mainly reflects on the color conversion efficiency, it is especially suitable for the display device with the light source of relatively wide spectrum, such as an electroluminescent device emitting white light or a back lighting device lighted by white light. In one possible embodiment, besides the light filter layer, the photon conversion layer and the reflecting interface, the display device further includes a light emitting layer to realize a self-luminous display device.

Figure 3:
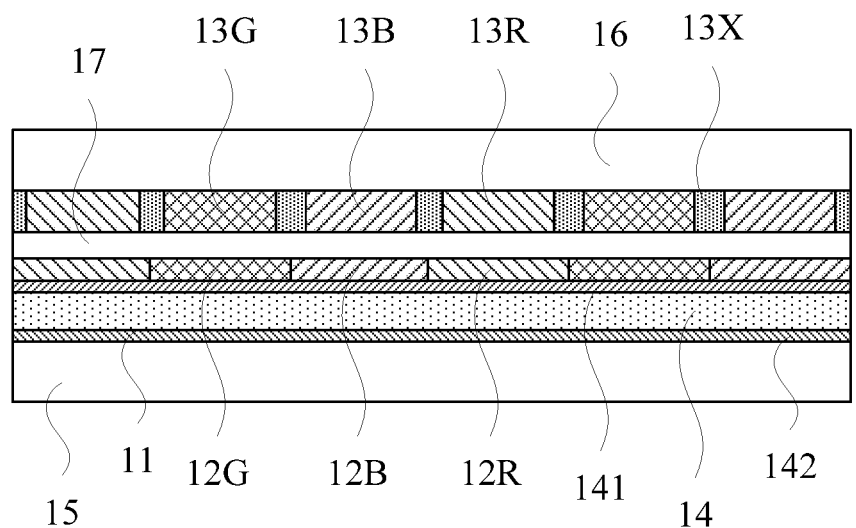
FIG. 3 is a sectional structural diagram of a display device of an embodiment of the present disclosure.

FIG. 3 is a sectional structural diagram of a display device provided by an embodiment of the present disclosure. Referring to FIG. 3, the display device in the embodiment of the present disclosure includes a light emitting layer 14. A first electrode layer 141 is arranged on aside of the light emitting layer that faces the display light emergent direction (the direction from bottom to top in FIG. 3), and a second electrode layer 142 is set up on an other side. The photon conversion layer 12 in the embodiment of the present disclosure includes a green photon conversion layer 12G, a blue photon conversion layer 12B and a red photon conversion layer 12R, that represent the photon conversion layers 12 arranged in the sub-pixel areas corresponding to green, blue and red respectively. The light filter layer 13 in the embodiment of the present disclosure includes a green light filter layer 13G, a blue light filter layer 13B and a red light filter layer 13R that represent the part of the light filter layer 13 arranged in the sub-pixel areas corresponding to green, blue, and red to transmit the target color light. In addition, the light filter layer 13 in the embodiment of the present disclosure also includes a light shielding layer 13X, which can be arranged in accordance with the Black Matrix (BM) arrangement method in the prior art, which is not repeated herein. In the embodiment shown in FIG. 3, the photon conversion layer 12 is located between the light filter layer 13 and the light emitting layer 14, while the surface of the second electrode layer 142 that faces the display light emergent direction forms the reflecting interface 11. In other possible embodiments, the reflecting interface 11 can also be formed by the surface of the first electrode layer 141 that faces the display light emergent direction, or the surface of the first electrode layer 141 together with the surface of the second electrode layer 142 that face the display light emergent direction. It is evident that in the embodiment of the present disclosure, the electrodes on two sides of the light emitting layer are used to form the reflecting interface so that the layer structures already within the electroluminescent device may be used to form the above reflecting interface, with no necessity to arrange other structures (for example, a metal reflecting film) to form the reflecting interface. Therefore, comparatively speaking, the total amount and the total thickness of the layer structures that are required to be arranged can be reduced, and it is beneficial to simplify the product structure. In another possible embodiment, the reflecting interface can be provided by a reflecting film arranged on the side of the photon conversion layer that is away from the light filter layer.

Figure 4:
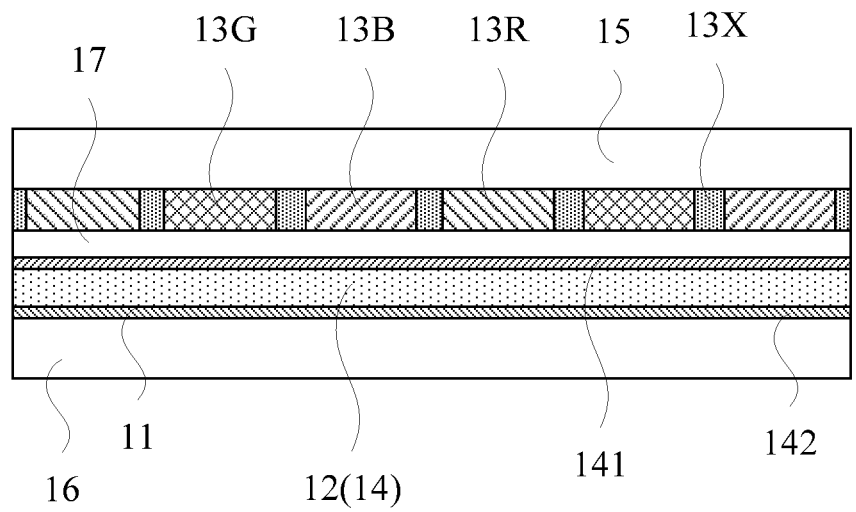
FIG. 4 is a sectional structural diagram of a display device of another embodiment of the present disclosure.

FIG. 4 is a sectional structural diagram of a display device provided by another embodiment of the present disclosure. Referring to FIG. 4, the photon conversion layer 12 in the embodiment of the present disclosure includes an electroluminescent material. Therefore, the photon conversion layer can also be used as the light emitting layer 14 in the display device simultaneously. In the embodiment of the present disclosure, the photon conversion layers 12 in the plurality of sub-pixel areas are formed of the same material, and the structure of the light filter layer 13 is the same as the structure of the light filter layer 13 shown in FIG. 3, which is not repeated again herein. The first electrode layer 141 is arranged on the side of the photon conversion layer 12 that faces the display light emergent direction (direction from bottom to top in FIG. 4) and the second electrode layer 142 is arranged on an other side. In the embodiment shown in FIG. 4, the surface of the second electrode layer 142 that faces the display light emergent direction forms the reflecting interface 11. In other possible embodiments, the reflecting interface 11 can also be formed by the surface of the first electrode layer 141 that faces the display light emergent direction, or the surface of the first electrode layer 141 together with the surface of the second electrode layer 142 that face the display light emergent direction. When the selected electroluminescent material also has the required characteristic of photoluminescence or the selected photoluminescent material also has the required characteristic of electroluminescence, the formed layer structure can be used as the photon conversion layer and the light emitting layer simultaneously. It is evident that the photon conversion layer and the light emitting layer can be simplified to one layer structure in the embodiment of the present disclosure so that not only the thickness can be reduced but also the manufacturing process can be simplified. In addition, the light can be reflected back and forth between the first electrode layer and the second electrode layer, which is beneficial for further increasing the color conversion efficiency.

In FIG. 3 and FIG. 4, besides the structure mentioned above, the display device can further include a substrate 15, a cover board 16 and a spacer layer 17, any one of which can be made of an insulation material such as glass, a silicon pellet, silicon oxide, silicon nitride, photoresist, etc. The light transmittance requirement may need to be satisfied, when any of the substrate 15, the cover board 16 and the spacer layer 17 is set up on the display light emergent side of the display device. In FIG. 3, the substrate 15 is located on the side of the reflecting interface 11 that is away from the photon conversion layer 12. The top emission of the display device can be realized based on the arrangement that the substrate is located on the side of the reflecting interface that is away from the photon conversion layer. In FIG. 4, the substrate 15 is located on the side of the light filter layer 13 that is away from the photon conversion layer 12. The bottom emission of the display device can be realized based upon the arrangement that the substrate is located on the side of the second optical thin film that is away from the dielectric layer. In addition, in other possible embodiments, the substrate can also be located between the reflecting interface and light filter layer, in which way the bottom emission of the display device can also be realized. Based upon the arrangement that the substrate is located between the reflecting interface and light filter layer, the manufacturing the display device can be changed to be implemented on both sides of the substrate, which is beneficial to improve the production efficiency and the good product yield rate. In addition, the spacer layer can also be arranged on both sides of the photon conversion layer, or between the photon conversion layer and the reflecting interface, apart from being arranged between the photon conversion layer and light filter layer. The spacer layer may not be arranged in the display device at all. During the implementation, the arrangement can be done in accordance with the actual demands, which will not be limited by the embodiment of the present disclosure.

In any of the above display devices, the materials that the photon conversion layer is made of include the pre-selected photoluminescent material, such as:

the first light emitting material, used to absorb a photon whose wavelength is within the third wavelength range in order to radiate a photon whose wavelength is within the first wavelength range (for example, the Stokes procedure);

the second light emitting material, used to absorb a photon whose wavelength is within the third wavelength range in order to radiate a plurality of photons among which at least one photon's wavelength is within the first wavelength range (for example, the Spontaneous Parametric Down-Conversion procedure); and the third light emitting material, used to absorb a plurality of photons whose wavelengths are within the third wavelength range in order to radiate a photon whose wavelength is within the first wavelength range (for example, the Anti-Stokes procedure).

As an exemplary embodiment, in the sub-pixel area corresponding to green, the photon whose energy is a bit higher than that of the green photon can be absorbed by the first light emitting material so that the electron in the first light emitting material transits from a ground state to a high energy state; after a period time of relaxation, the electron transits to a sub-high energy state, then the electron radiates a green photon by transiting from the sub-high energy state to the ground state. Therefore, the methods of arranging the first light emitting material for the photon conversion layer in the sub-pixel area corresponding to green may include: to find the material with the above ground state, the high energy state, the sub-high energy state and the relaxation attributes based on those the above photoluminescence procedure can be realized and with the conversion efficiency which satisfies the application requirement under the application environment of the display device among the photoluminescent material.

As another exemplary embodiment, in the sub-pixel area corresponding to red, the photon whose energy is integer multiple of that of the red photon can be absorbed by the second light emitting material so that the electron in the second light emitting material transits from the ground state to the high energy state; after the transition, the electron successively radiates several red photons by successively transiting to several relatively low energy states. Therefore, the methods of arranging the second light emitting material for the photon conversion layer in the sub-pixel area corresponding to red may include: to find the material with the energy levels based on which the above photoluminescence procedure can be realized and with the conversion efficiency which satisfies the application requirement under the application environment of the display device among the photoluminescent material.

As a further exemplary embodiment, in the sub-pixel area corresponding to blue, several photons whose energy is lower than that of the blue photon (for example, two red photons, or one red and one green photon, the total energy of which equals to the energy of the blue photon) can be absorbed by the third light emitting material so that the electron in the third light emitting material reaches the high energy state after more than one transition and then radiates a blue photon by transiting from the high energy state to the ground state. Therefore, the methods of arranging the third light emitting material for the photon conversion layer in the sub-pixel area corresponding to blue may include: to find the material with the energy levels based on which the above photoluminescence procedure can be realized and with the conversion efficiency which satisfies the application requirement under the application environment of the display device among the photoluminescent material.

In one possible embodiment, the first light emitting material may be selected from the materials containing the organic phosphorescence material, the organic fluorescence material, the inorganic phosphorescence material, the inorganic fluorescence material, and semiconductor quantum dot material; the second light emitting material may be selected from the materials containing the nonlinear crystal material (for example, BBO crystal, KDP crystal), semiconductor quantum dot material, nanocrystal material (including but not limited to rare-earth ion mixture), and other nonlinear optical materials; the third light emitting material may be selected from the materials containing the semiconductor quantum dots material, the nanocrystal material (including but not limited to rare-earth ion mixture), and other nonlinear optical materials.

It is evident that based upon the at least one of the light emitting materials mentioned above, the light that is excluded from the light corresponding to the required color can be converted to the light corresponding to the required color so that light energy within more light emitting waveband in the light emitting layer can be utilized, thereby improving the color conversion efficiency.

In the display device as shown in FIG. 3, the red photon conversion layer 12R is the photon conversion layer 12 within the sub-pixel area corresponding to red and can be formed from the first and second light emitting materials; the green photon conversion layer 12G is the photon conversion layer 12 within the sub-pixel area corresponding to green and can be formed from the first and third light emitting materials; the blue photon conversion layer 12B is the photon conversion layer 12 within the sub-pixel area corresponding to blue and can be formed from the third light emitting material. The photon conversion layer applied to the white light source may be formed based upon such a combination of the materials described above. For example, the red photon conversion layer 12R in the embodiment of the present disclosure can convert the green and blue light in the visible light to the red light based upon the photoluminescence attribute of the first light emitting material, and can convert the blue and purple light and even the ultraviolet light in the visible light to the red light based upon the photoluminescence attribute of the second light emitting material; the green photon conversion layer 12G in the embodiment of the present disclosure can convert the blue light in the visible light to the green light based upon the photoluminescence attribute of the first light emitting material, and can convert the red or infrared light to the green light based upon the photoluminescence attribute of the third light emitting material; the blue photon conversion layer 12B in the embodiment of the present disclosure can convert the red light and green light in the visible light to the blue light based upon the photoluminescence attribute of the third light material, to make the most use of the waveband with relatively higher energy ratio in the white light source. It is evident that based up the respective photon conversion layer made of different materials in the each sub-pixel area corresponding to each color, the corresponding material may be set up based upon the attribute of each color itself in order to reduce the amount of the material used in the photon conversion layer and improve the color conversion effect.

More generally, similar to the method mentioned above of setting up the material that the photon conversion layer is made of in accordance with the luminescent spectrum of the white light source, the third wavelength range can be preset beyond the first wavelength range in accordance with the luminescent spectrum of the display light source in any possible embodiment. For example, when the photon conversion layer is arranged in the sub-pixel area corresponding to red, the luminescent spectrum of the display light source can be obtained first; when it's known that the main luminescent waveband of the light source is concentrated in the red and green light wavebands, the photoluminescent material with the absorption spectrum matching with the green light waveband may be used as much as possible to replace other photoluminescent materials, in order to realize a more excellent better color conversion efficiency. It is evident that in the embodiment of the present disclosure, the photon conversion material can be set up specifically, based upon the interrelationship between the third wavelength range and the luminescent spectrum of the display light source, which is beneficial to reduce the usage amount of the material and further improve the color conversion efficiency.

In the display device shown in FIG. 4, the photon conversion layers 12 in the plurality of sub-pixel areas are made of the same material, That is to say, a photoluminescent material or a combination of multiple photoluminescent materials can be used to realize the wavelength conversion in every sub-pixel area. Based upon this, although the actual color conversion efficiency may be relatively low and there is an extra material more or less in each sub-pixel area, the arrangement can make the photon conversion layer be formed of the same homogeneous material and therefore there is no need to manufacture the photon conversion layer in each color sub-pixel area respectively with a relatively complex manufacturing process so that the manufacturing process can be simplified.

Figure 5:
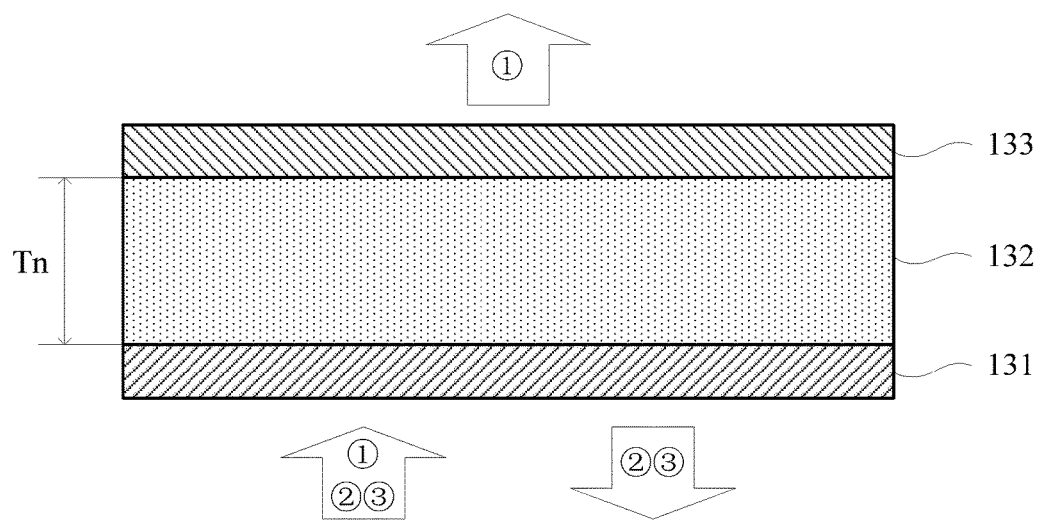
FIG. 5 is a sectional structural diagram of a light filter layer within a sub-pixel area of a display device of an embodiment of the present disclosure.

FIG. 5 is the sectional structural diagram of a light filter layer in a sub-pixel area of the display device provided by an embodiment of the present disclosure. Referring to FIG. 5, the light filter layer in the embodiment of the present disclosure includes a first optical film 131, a first medium layer 132, and a second optical film 133, wherein:

The first optical film 131 and the second optical film 133 are located on the side of the first medium layer 132 that is close to the photon conversion layer and the side away from the photon conversion layer respectively. Therefore, the display light emergent direction in FIG. 5 is still from bottom to top. Based upon the sandwich structure formed of the first optical film 131, the first medium layer 132 and the second optical film 133, the resonant cavity that is used to transmit the light within the first wavelength range is formed between the first optical film 131 and the second optical film 133.

For example, both the first optical film 131 and the second optical film 133 can be 25-mm-thick silver film, while the first medium layer 132 can be an isolation material layer with a refractive index of 1.5. Based upon the attribute of the resonant cavity, the peak wavelength of the transmission light is determined mainly by the optical length of the resonant cavity, that is, the distance between the first optical film 131 and the second optical film 133 (or the thickness of the first medium layer 132) Tn. In the display devices shown in FIG. 3 and FIG. 4, the optical length of the resonant cavity that forms the green light filter layer 13G is Tn=130 nm (nanometer, a length unit), the optical length of the resonant cavity that forms the blue light filter layer 13B is Tn=100 nm, and the optical length of the resonant cavity that forms the red light filter layer 13G is Tn=160 nm. Thus, by arranging the first optical film 13, the first medium layer 132 and the second optical film 133 with the structure illustrated in FIG. 5 in each sub-pixel area, the light filter layer 13 of the display device can be structured together with the light shielding layer 13X as shown in FIG. 3 and FIG. 4 and has the attribute to transmit the light within the first wavelength range that corresponds to the sub-pixel area where it is located.

On the other hand, in the structure shown in FIG. 5, the interface between the first optical film 131 and the first medium layer 132, or the interface between the second optical film 133 and the first medium layer 132, or the combination of the two interfaces can form the reflecting interface used to reflect the light within the second wavelength range. For example, when the first optical film 131 and the second optical film 133 are formed of a silver film, both the interface between the first optical film 131 and the first medium layer 132 and the interface between the second optical film 133 and the first medium layer 132 have a very high reflectivity to the light within a very wide waveband, and therefore both interfaces form the reflecting interface used to reflect the light within the second wavelength range. Thus it can be known that the attributes for transmission and reflection satisfying the application requirement can be realized by arranging the light filter layer that includes the first optical film, the first medium layer, and the second optical film. For example, for the incident beam that includes part 1 ①, part 2 ②, and part 3 ③, the light filter layer in the embodiment of the present disclosure can transmit part 1 ① and reflect part 2 ② and part 3 ③. In addition, compared with the absorbent color filter in the related art, the reflection replaces the absorption for the light filter layer in the embodiment of the present disclosure so that the light energy within more wavebands can be utilized together with the arrangement of the photon conversion layer, which is beneficial to improve the color conversion efficiency of the display device.

Figure 6:
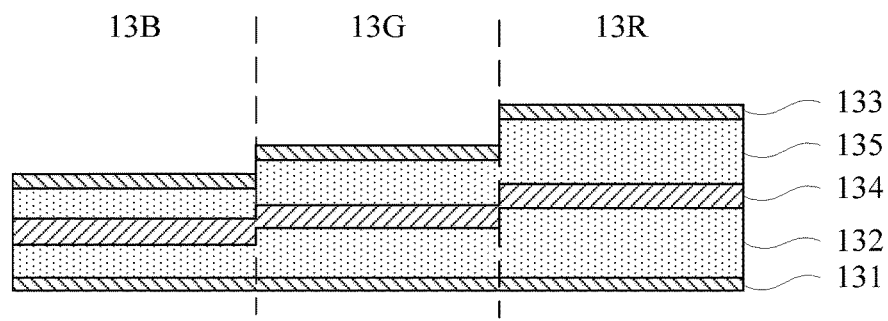
FIG. 6 is a sectional structural diagram of a light filter layer in a display device of another embodiment of the present disclosure.

As another embodiment, at least one medium layer and at least one optical film can be included between the first medium layer and the second optical film so that the multi-mirror resonant cavity can be formed between the first optical film and the second optical film. For example, FIG. 6 is a sectional structural diagram of a light filter layer of a display device provided by another embodiment of the present disclosure. The display light emergent direction is from bottom to top in FIG. 6. Referring to FIG. 6, the light filter layer in the embodiment of the present disclosure further includes a third optical film 134 and a second medium layer 135 that are arranged between the first medium layer 132 and the second optical film 133, in addition to the first optical film 131, the first medium layer 132 and the second optical film 133. Wherein, the third optical film 134 is arranged between the first medium layer 132 and the second medium layer 135, and the surfaces of both sides of the third optical film 134, which are used as cavity mirrors to transmit and reflect light, form the multi-mirror resonant cavity between the first optical film 131 and the second optical film 132 (that is, the resonant cavity contains two or more cavity mirrors). In order that the multi-mirror resonant cavity in the embodiment of the present disclosure can transmit the light within the first light wavelength range and reflect the light within the second light wavelength range, the distance between each optical film and the thickness of each optical film and each medium layer need to be set up based upon the Fabry-Pérot principle. For example, as shown in FIG. 6, the distance between the first optical film 131 and the third optical film 134 may vary in different color sub-pixel areas. The distance between the second optical film 133 and the third optical film 134 may also vary in different color sub-pixel areas. Appropriate addition of the cavity mirror can improve the light transmission of the resonant cavity (for example, raise the transmittance of the light within the first wavelength range and/or reduce the transmittance of the light beyond the first wavelength range) and further help improve the display effect.

In other possible embodiments, more optical films and medium layers can be arranged between the first medium layer and the second optical film. Wherein, the medium layer is arranged between two optical films next to each other along the thickness direction, and the surfaces of both sides of the optical film are used as the cavity mirror to transmit and reflect light, to form the resonant cavity with more cavity mirrors (the medium layer thickness can adjust the distance between the cavity mirrors). In the embodiment of the present disclosure, based upon the arrangement of the multi-mirror optical resonant cavity formed with multiple medium layers and multiple optical films, a more excellent color filtering effect can be achieved. In addition, the arrangement of more optical films can make more light be reflected to the photon conversion layer, which reduces the energy loss of the light within the third wavelength range and therefore further improve the color conversion efficiency of the display device.

It should be noted that in any possible embodiment, the optical film can be made of metals such as silver, copper, aluminum, molybdenum, nickel, etc. or dielectric materials. It can be a thin film made of a single layer material or a composite film layer structure made of a multilayer film, and can be selected based upon the application requirements, such as the reflectivity, the refractive index, etc.; the medium layer can be made of medium materials, such as silicon oxide, silicon nitride, aluminum nitride, photoresist, etc. The medium layer can be a single layer structure or a multilayer structure and can be selected based upon the application requirements, such as the reflectivity, refractive index, etc., which will not be limited by the embodiment of the present disclosure.

The foregoing are only some embodiments of the present disclosure, and are not intend to limit the disclosure. Within the spirit and principles of the disclosure, any modifications, equivalent substitutions, improvements, etc., are protected within the scope of the present disclosure.

What is claimed is:

1. A display device, comprising a plurality of sub-pixel areas, each of which corresponds to one color, wherein the display device comprises a reflecting interface, a photon conversion layer, and a light filter layer arranged sequentially along a display light emergent direction; in the sub-pixel area corresponding to a target color:
    the light filter layer is structured to transmit light within a first wavelength range in the display light emergent direction and reflect the light within a second wavelength range, wherein the first wavelength range refers to the wavelength range corresponding to the target color, and the second wavelength range includes a visible light waveband excluding the first wavelength range;
    the reflecting interface is structured to reflect the light from the light filter layer; and
    the photon conversion layer is structured to convert the transmitted light within third wavelength range to the light within the first wavelength range, the third wavelength range is a preset wavelength range beyond the first wavelength range and the second wavelength range includes the third wavelength range;
    wherein, the target color is any of colors corresponding to the plurality of sub-pixel areas.

2. The display device of claim 1, further comprising a light emitting layer, wherein a first electrode layer is arranged on one side of the light emitting layer that faces the display light emergent direction and a second electrode layer is arranged on another side thereof; the photon conversion layer is located between the light filter layer and the light emitting layer, and at least one of a surface of the first electrode layer that faces the display light emergent direction and a surface of the second electrode layer that faces the display light emergent direction forms the reflecting interface.

3. The display device of claim 2, further comprising a substrate; wherein the substrate is located on any of the following places:
    a side of the reflecting interface that is away from the photon conversion layer,
    a place between the reflecting interface and the light filter layer,
    a side of the light filter layer that is away from the photon conversion layer.

4. The display device of claim 2, wherein the colors corresponding to the plurality of sub-pixel areas comprise red, green, and blue;
    in a sub-pixel area corresponding to red, the photon conversion layer includes a first light emitting material and a second light emitting material;
    in a sub-pixel area corresponding to green, the photon conversion layer includes the first light emitting material and a third light emitting material; and
    in a sub-pixel area corresponding to blue, the photon conversion layer includes the third light emitting material;
    wherein, the first light emitting material is used to absorb a photon whose wavelength is within the third wavelength range in order to radiate a photon whose wavelength is within the first wavelength range; the second light emitting material is used to absorb a photon whose wavelength is within the third wavelength range in order to radiate a plurality of photons among which at least one photon's wavelength is within the first wavelength range; and the third light emitting material is used to absorb a plurality of photons whose wavelengths are within the third wavelength range in order to radiate a photon whose wavelength is within the first wavelength range.

5. The display device of claim 1, wherein the photon conversion layer comprises an electroluminescent material, a first electrode layer is arranged on one side of photon conversion layer that faces the display light emergent direction and a second electrode layer is arranged on an other side thereof; an interface between the second electrode layer and the photon conversion layer forms the reflecting interface.

6. The display device of claim 5, further comprising a substrate; wherein the substrate is located on any of the following places:
    a side of the reflecting interface that is away from the photon conversion layer,
    a place between the reflecting interface and the light filter layer,
    a side of the light filter layer that is away from the photon conversion layer.

7. The display device of claim 5, wherein the colors corresponding to the plurality of sub-pixel areas include red, green, and blue;
    in a sub-pixel area corresponding to red, the photon conversion layer includes a first light emitting material and a second light emitting material;
    in a sub-pixel area corresponding to green, the photon conversion layer includes the first light emitting material and a third light emitting material; and
    in a sub-pixel area corresponding to blue, the photon conversion layer includes the third light emitting material;
    wherein, the first light emitting material is used to absorb a photon whose wavelength is within the third wavelength range in order to radiate a photon whose wavelength is within the first wavelength range; the second light emitting material is used to absorb a photon whose wavelength is within the third wavelength range in order to radiate a plurality of photons among which at least one photon's wavelength is within the first wavelength range; and the third light emitting material is used to absorb a plurality of photons whose wavelengths are within the third wavelength range in order to radiate a photon whose wavelength is within the first wavelength range.

8. The display device of claim 1, wherein the light filter layer comprises a first optical film, a first medium layer, and a second optical film; in each of the sub-pixel area, the first optical film and the second optical film are located on a side of the first medium layer that is close to the photon conversion layer and a side that is away from the photon conversion layer respectively, to form a resonant cavity between the first and the second optical films to transmit the light within the first wavelength range; and an interface between the first optical film and the first medium layer and/or an interface between the second optical film and the first medium layer form the reflecting interface to reflect the light within the second wavelength range.

9. The display device of claim 8, further comprising a substrate; wherein the substrate is located on any of the following places:
    a side of the reflecting interface that is away from the photon conversion layer,
    a place between the reflecting interface and the light filter layer,
    a side of the light filter layer that is away from the photon conversion layer.

10. The display device of claim 8, wherein the colors corresponding to the plurality of sub-pixel areas include red, green, and blue;
    in a sub-pixel area corresponding to red, the photon conversion layer includes a first light emitting material and a second light emitting material;
    in a sub-pixel area corresponding to green, the photon conversion layer includes the first light emitting material and a third light emitting material; and
    in a sub-pixel area corresponding to blue, the photon conversion layer includes the third light emitting material;
    wherein, the first light emitting material is used to absorb a photon whose wavelength is within the third wavelength range in order to radiate a photon whose wavelength is within the first wavelength range; the second light emitting material is used to absorb a photon whose wavelength is within the third wavelength range in order to radiate a plurality of photons among which at least one photon's wavelength is within the first wavelength range; and the third light emitting material is used to absorb a plurality of photons whose wavelengths are within the third wavelength range in order to radiate a photon whose wavelength is within the first wavelength range.

11. The display device of claim 10, wherein an optical length of the resonant cavity corresponding to a red sub-pixel area is 160 nanometers, the optical length of the resonant cavity corresponding to a green sub-pixel area is 130 nanometers, and the optical length of the resonant cavity corresponding to a blue sub-pixel area is 100 nanometers.

12. The display device of claim 8, wherein at least one medium layer and at least one optical film are included between the first medium layer and the second optical film, to form a multi-mirror resonant cavity between the first optical film and the second optical film.

13. The display device of claim 12, further comprising a substrate; wherein the substrate is located on any of the following places:
    a side of the reflecting interface that is away from the photon conversion layer,
    a place between the reflecting interface and the light filter layer,
    a side of the light filter layer that is away from the photon conversion layer.

14. The display device of claim 12, wherein the colors corresponding to the plurality of sub-pixel areas include red, green, and blue;
    in a sub-pixel area corresponding to red, the photon conversion layer includes a first light emitting material and a second light emitting material;
    in a sub-pixel area corresponding to green, the photon conversion layer includes the first light emitting material and a third light emitting material; and
    in a sub-pixel area corresponding to blue, the photon conversion layer includes the third light emitting material;
    wherein, the first light emitting material is used to absorb a photon whose wavelength is within the third wavelength range in order to radiate a photon whose wavelength is within the first wavelength range; the second light emitting material is used to absorb a photon whose wavelength is within the third wavelength range in order to radiate a plurality of photons among which at least one photon's wavelength is within the first wavelength range; and the third light emitting material is used to absorb a plurality of photons whose wavelengths are within the third wavelength range in order to radiate a photon whose wavelength is within the first wavelength range.

15. The display device of claim 1, wherein the third wavelength range is preset in accordance with an emission spectrum of a display light source.

16. The display device of claim 1, further comprising a substrate; wherein the substrate is located on any of the following places:
    a side of the reflecting interface that is away from the photon conversion layer,
    a place between the reflecting interface and the light filter layer,
    a side of the light filter layer that is away from the photon conversion layer.

17. The display device of claim 1, wherein in the sub-pixel area corresponding to the target color, the photon conversion layer comprises at least one of a first light emitting material and a second light emitting material and a third light emitting material;
    the first light emitting material is used to absorb a photon whose wavelength is within the third wavelength range in order to radiate a photon whose wavelength is within the first wavelength range;
    the second light emitting material is used to absorb a photon whose wavelength is within the third wavelength range in order to radiate a plurality of photons among which at least one photon's wavelength is within the first wavelength range; and
    the third light emitting material is used to absorb a plurality of photons whose wavelengths are within the third wavelength range in order to radiate a photon whose wavelength is within the first wavelength range.

18. The display device of claim 16, wherein the photon conversion layers in the plurality of sub-pixel areas are all made of the same material.

19. The display device of claim 1, wherein the colors corresponding to the plurality of sub-pixel areas include red, green, and blue;
    in a sub-pixel area corresponding to red, the photon conversion layer includes a first light emitting material and a second light emitting material;
    in a sub-pixel area corresponding to green, the photon conversion layer includes the first light emitting material and a third light emitting material; and in a sub-pixel area corresponding to blue, the photon conversion layer includes the third light emitting material;

wherein, the first light emitting material is used to absorb a photon whose wavelength is within the third wavelength range in order to radiate a photon whose wavelength is within the first wavelength range; the second light emitting material is used to absorb a photon whose wavelength is within the third wavelength range in order to radiate a plurality of photons among which at least one photon's wavelength is within the first wavelength range; and the third light emitting material is used to absorb a plurality of photons whose wavelengths are within the third wavelength range in order to radiate a photon whose wavelength is within the first wavelength range.

20. The display device of claim 1, wherein the display device is a display panel, a mobile phone, a tablet, a TV, a display device, a laptop, a digital photo frame, or a navigator.

* * * * *